(12) United States Patent
Uchiumi et al.

(10) Patent No.: US 7,825,555 B2
(45) Date of Patent: Nov. 2, 2010

(54) SURFACE MOUNT-TYPE VIBRATION MOTOR AND FIXATION STRUCTURE FOR SURFACE MOUNT-TYPE VIBRATION MOTOR

(75) Inventors: Hidehiro Uchiumi, Tokyo (JP); Kazuo Morita, Tokyo (JP); Toshio Suzuki, Tokyo (JP); Tomohide Aoyagi, Tokyo (JP); Takeshi Kogawa, Tokyo (JP); Mitsugu Kudo, Tokyo (JP)

(73) Assignee: Namiki Seimitsu Houseki Kabushiki Kaisha (JP)

( * ) Notice: Subject to any disclaimer, the term of this patent is extended or adjusted under 35 U.S.C. 154(b) by 494 days.

(21) Appl. No.: 10/583,715

(22) PCT Filed: Dec. 21, 2004

(86) PCT No.: PCT/JP2004/019050
§ 371 (c)(1),
(2), (4) Date: Oct. 27, 2008

(87) PCT Pub. No.: WO2005/064770
PCT Pub. Date: Jul. 14, 2005

(65) Prior Publication Data
US 2009/0218896 A1 Sep. 3, 2009

(30) Foreign Application Priority Data
Dec. 26, 2003 (JP) ............................ 2003-435657

(51) Int. Cl.
*H02K 7/065* (2006.01)
*B06B 1/16* (2006.01)
(52) U.S. Cl. ........................................ 310/81; 310/91

(58) Field of Classification Search ................ 310/81
See application file for complete search history.

(56) References Cited

U.S. PATENT DOCUMENTS

| 5,986,367 | A | * | 11/1999 | Tsuzaki et al. ............ 310/71 |
| 6,081,055 | A |   | 6/2000  | Narusawa |
| 6,133,657 | A | * | 10/2000 | Semenik et al. ............ 310/81 |
| 2007/0241626 | A1 | * | 10/2007 | Suzuki et al. ............ 310/71 |

FOREIGN PATENT DOCUMENTS

| EP | 0840424 | * | 5/1996 |
| JP | 11-234943 |   | 8/1999 |
| JP | 2003-143799 |   | 5/2003 |

* cited by examiner

*Primary Examiner*—Burton Mullins
(74) *Attorney, Agent, or Firm*—Studebaker & Brackett PC; Donald R. Studebaker

(57) ABSTRACT

A surface mount-type vibration motor and an installation structure for a surface mount-type vibration motor, where soldered portions are prevented from separating from a circuit board without requiring any design change in a vibration motor body. A section where a motor holding section of a motor holder and motor support sections of the motor holder are connected is bent in an arc shape having elasticity to form the motor holder, the motor holding section holding a vibration motor body to which an elastic holder is attached, the motor support sections being arranged along a circuit board. First contact sections and second contact sections are formed in the connection section such that distal ends of the first and second contact sections are of a band-like shape projecting toward the inside of the vibration motor body. The motor holder reduces a load applied to portions where the surface mount-type vibration motor is soldered to the circuit board and also improves bonding strength.

10 Claims, 9 Drawing Sheets

SURFACE MOUNT-TYPE VIBRATION MOTOR AND FIXATION STRUCTURE FOR SURFACE MOUNT-TYPE VIBRATION MOTOR

TECHNICAL FIELD

This invention relates to a surface mount-type vibration motor and a fixation structure for the surface mount-type vibration motor, more specifically to a surface mount-type vibration motor provided with a motor holder to be soldered to a circuit board and an installation structure of the surface mount-type vibration motor.

BACKGROUND ART

Recently, electronic parts for electronic devices are often designed as a board surface mount-type using reflow solder for the convenience of assembly. These electronic parts are designed so that cream solder is placed on a specified position of a printed circuit board (hereafter referred to as "board" as required), and after processing, each electronic device is bonded to the board by cream solder melted in a heating furnace.

In addition, the vibration motor body recently used by some mobile phones is also designed as a surface mount-type component comprising a motor holder having a motor holding section for covering and holding the housing of the vibration motor and a motor support section for holding the motor holding section on a board, and a power supply terminal for supplying power to the vibration motor body connected to a power supply land provided to the board, in other words, as a reflow component as a surface mount-type vibration motor, in a way similar to the above electronic parts. In such a way, the aforementioned surface mount-type vibration motor is directly bonded to the board by molten solder in a process different from the conventional method (for example, patent references 1 and 2).

Patent reference 1: Japanese Patent Laid-Open Publication No. 11-234943

Patent reference 2: Japanese Patent Laid-Open Publication No. 2003-143799

SUMMARY OF THE INVENTION

However, the surface mount-type vibration motor is far larger than other general electronic components in size and weight. Therefore, if a mobile phone equipped with a surface mount-type vibration motor is accidentally dropped, an inertia load in proportion to weight (self-weight) will be added to the surface mount-type vibration motor. Thus, the surface mount-type vibration motor has a problem that it is easily separated from the bonding surface of a board because a soldered portion is subjected to a load larger than that applied to a soldered portion of other conventional electronic components. In addition, it is natural that the portion where a surface mount-type vibration motor is soldered to a board is always subjected to vibration generated from its own operation when the surface mount-type vibration motor is active because the surface mount-type vibration motor functions as a vibration generating device. Therefore, since the soldered portion is subjected to larger gyratory load in comparison with other electronic components, the surface mount-type vibration motor has a major problem that it can separate more easily.

The contact portion where the aforementioned power supply terminal for the surface mount-type vibration motor is soldered to the power supply land provided on a board also has a problem of separation similar to the above. Especially, when the contact portion on the board surface soldered to the above power supply terminal happens to be separated, there arises a significant problem wherein the vibration motor body becomes inactive due to poor electrification.

Thus, the purpose of this invention is to provide a surface mount-type vibration motor that can prevent the surface mount-type vibration motor soldered to a circuit board from separating from the aforementioned circuit board, provide a structure for easy installation on the circuit board, generate more stable bonding strength and, moreover, sufficiently transmit vibration to an enclosure when the motor is actuated.

In order to solve the above problem, the invention provides a surface mount-type vibration motor comprising a vibration motor body of which an output shaft end is attached with an eccentric weight and a motor holder that is installed to the aforementioned vibration motor body to place the aforementioned vibration motor body on a board, a part of the aforementioned motor holder is bonded on the aforementioned board using reflow solder, wherein the aforementioned motor holder is formed by a metal sheet, has a motor holding section for covering a periphery of the aforementioned vibration motor body to hold the aforementioned vibration motor body, and has a motor support sections that extend in an axial direction of the aforementioned output shaft over the aforementioned board and is in contact with the aforementioned board, and a connection section extending from the aforementioned motor holding section to the aforementioned motor support section that is bent in an arc shape having elasticity and is provided with openings.

The invention provides a surface mount-type vibration motor, wherein end sections of the aforementioned motor support section of the aforementioned motor holder are provided with extended support sections that extend in an axial direction of the aforementioned output shaft over the aforementioned board and are in contact with the aforementioned board, and distal ends of the aforementioned extended support sections of the aforementioned motor holder are positioned between the gravity center of the aforementioned eccentric weight and the distal end of the aforementioned eccentric weight in the axial direction of the aforementioned output shaft.

The invention provides a surface mount-type vibration motor, wherein the aforementioned motor holding section of the aforementioned motor holder is extended along the periphery of the aforementioned vibration motor in a cylindrical shape when installed to the aforementioned vibration motor body, the aforementioned motor support sections of the aforementioned motor holder are provided with uniform plane sections extending in an axial direction of the aforementioned motor holding section of the aforementioned motor holder from the periphery of the aforementioned vibration motor body toward the outside.

The invention provides a surface mount-type vibration motor, wherein one end of the aforementioned motor support section of the aforementioned motor holder is provided with a first contact section that is in contact with the aforementioned board and extends toward the inside of the aforementioned vibration motor body soldered to the aforementioned board, and the other end of the aforementioned motor support section of the aforementioned motor holder is provided with a second contact section that is in contact with the aforementioned board and extends toward the inside of the aforementioned vibration motor body soldered to the aforementioned board.

The invention provides a surface mount-type vibration motor, wherein the aforementioned first contact section and the aforementioned second contact section are combined alternately on the aforementioned board and are arranged to provide the aforementioned combined portion with an opening.

The invention provides a surface mount-type vibration motor, wherein an elastic holder for covering the aforementioned vibration motor body is provided between the aforementioned vibration motor body and the aforementioned motor holder.

The invention provides a surface mount-type vibration motor, wherein the aforementioned vibration motor body comprises a power supply terminal to be soldered to a power supply land provided to the aforementioned board, and a part of the aforementioned power supply terminal is provided with an elastic bending section.

The invention provides a surface mount-type vibration motor that comprises a vibration motor body of which a distal end of an output shaft is attached with an eccentric weight and a motor holder to be installed to the aforementioned vibration motor body to place the aforementioned vibration motor body on a board and that is bonded on the aforementioned board using reflow solder, wherein aforementioned motor holder is provided with a motor holding section for covering a periphery of the aforementioned vibration motor body to hold the aforementioned vibration motor body and motor support sections that extend in an axial direction of the aforementioned output shaft over the aforementioned board and are in contact with the aforementioned board, and an uppermost portion of the aforementioned motor holding section for holding the aforementioned vibration motor body at the position opposite to the aforementioned motor support section is provided with an elastic support body.

The invention provides a surface mount-type vibration motor, wherein the aforementioned vibration motor body comprises a power supply terminal to be soldered to a power supply land provided to the aforementioned board, and the aforementioned power supply terminal comprises an elastic bending section.

The invention provides an installation structure for a surface mount-type vibration motor, wherein the surface mount-type vibration motor comprising a vibration motor body of which an output shaft end is attached with an eccentric weight and a motor holder that has a motor holding section for covering a periphery of the aforementioned vibration motor body to hold the aforementioned vibration motor body, motor support sections that extend in an axial direction of the aforementioned output shaft over the aforementioned board and are in contact with the aforementioned board, a connection section of the motor holder between the aforementioned motor holding section and the aforementioned motor support sections are formed by a metal sheet in an arc shape, the aforementioned surface mount-type vibration motor is bonded to the aforementioned board that is fixed between one of a pair of housing cases forming a frame body by fitting to each other and assembling them and an internal board using reflow solder, an elastic support body is arranged between the aforementioned case of the pair and the aforementioned surface mount-type vibration motor, and the aforementioned surface mount-type vibration motor is held between the internal board and the housing case through the aforementioned elastic support body by assembling the aforementioned pair of housing cases.

According to the invention, since the connection section between the aforementioned motor holding section and the aforementioned motor support section is provided with small sections of the aforementioned motor holder that are formed by bending in an arc shape having elasticity, when the aforementioned surface mount-type vibration motor is assembled with the aforementioned board, a load generated by an external shock load and applied to a soldered portion can be absorbed by the aforementioned connection section. In other words, according to this invention, the connection section between the aforementioned motor holding section and the aforementioned motor support sections can reduce a load applied to a portion where the aforementioned surface mount-type vibration motor is soldered to the aforementioned board, thus providing an effect of preventing the aforementioned surface mount-type vibration motor from separating from the aforementioned board.

According to the invention, since the aforementioned extended support sections are additionally provided and strongly bonded onto the aforementioned board even if the portion where the aforementioned surface mount-type vibration motor is soldered to the aforementioned board is subjected to a strong load that may allow the aforementioned weight to approach to the aforementioned board or that may separate the aforementioned surface mount-type vibration motor from the aforementioned board, the aforementioned surface mount-type vibration motor can stably be bonded to the aforementioned board. Therefore, the load applied to the soldered portion can be dispersed and reduced. In other words, according to this invention, since the load applied to the soldered portion where the aforementioned surface mount-type vibration motor is bonded to the aforementioned board can be reduced by allowing the aforementioned extended support sections to receive the load even if the portion where the aforementioned surface mount-type vibration motor is soldered to the aforementioned board is subjected to a load that may allow the aforementioned weight to approach to the aforementioned board or that may separate the aforementioned surface mount-type vibration motor from the aforementioned board, the aforementioned surface mount-type vibration motor can be prevented from separating from the aforementioned board even if the aforementioned load is applied. In addition, the aforementioned extended support sections placed on the aforementioned circuit board can stably mount the aforementioned surface mount-type vibration motor on a plane. That is to say, an effect that the main unit of the motor is prevented from inclining toward the gravity center of the eccentric weight can be obtained.

According to the invention, since the motor holder is equipped with the aforementioned motor support sections provided to the right and left ends of the aforementioned motor holding section, the load applied to the portion where the surface mount-type vibration motor is soldered to the aforementioned board can effectively be absorbed and stably supported by the connection section between the aforementioned motor holding section and the aforementioned motor support sections provided close to the aforementioned right and left ends. Therefore, the load applied to the portion where the surface mount-type vibration motor is soldered to the aforementioned board can effectively be reduced. In other words, according to this invention, since the load applied to the portion where the surface mount-type vibration motor is soldered to the aforementioned board can effectively be reduced by the connection section between the aforementioned motor holding section and the aforementioned motor support section provided close to the aforementioned right and left ends, the aforementioned surface mount-type vibration motor can effectively be prevented from separating from the aforementioned board.

According to the invention, since the aforementioned first contact section and the aforementioned second contact section are provided, a contact area between the aforementioned surface mount-type vibration motor and the aforementioned circuit board can be enlarged. Therefore, a bonding strength at the interface between the aforementioned surface mount-type vibration motor and the aforementioned circuit board can be increased, and the stress applied to the portion where the surface mount-type vibration motor is soldered to the aforementioned board can be reduced. In other words, according to this invention, since the aforementioned first contact section and the aforementioned second contact section can increase the bonding strength at the interface between the aforementioned surface mount-type vibration motor and the aforementioned circuit board and can reduce the aforementioned stress applied to the portion where the surface mount-type vibration motor is soldered to the aforementioned board, the aforementioned surface mount-type vibration motor can be prevented from separating from the aforementioned board. Further, since a modulus of section at the aforementioned connection section can be adjusted by changing a ratio of band width of the aforementioned connection section to the motor holder opening at the aforementioned first and second contact sections, the effect that the modulus of section at the aforementioned connection section can be adjusted to a proper value regardless of a material of the motor holder is obtained.

According to the invention, since molten solder infiltrates into the aforementioned spaces surrounded by the aforementioned first contact section and the aforementioned second contact section to enlarge a solder extending area during the time when the solder is solidified to form a swelling due to surface tension, the aforementioned first contact section and the aforementioned second contact section can be strongly solder-bonded with the surface of the aforementioned board. Therefore, even if the aforementioned surface mount-type vibration motor is subjected to a load that acts to separate it from the aforementioned board, the solder portion solidified forming a swelling can stably retain the aforementioned surface mount-type vibration motor. In other words, according to this invention, since the solder portion solidified forming a swelling can stably retain the aforementioned surface mount-type vibration motor when the aforementioned surface mount-type vibration motor is subjected to a load in a direction along the aforementioned board, an effect that the aforementioned surface mount-type vibration motor can be prevented from separating from the aforementioned board even if the aforementioned surface mount-type vibration motor is subjected to the load in the direction along the aforementioned board is obtained.

According to the invention, since the aforementioned elastic holder is provided, a load applied to the aforementioned motor holder from the aforementioned vibration motor body can be absorbed by the aforementioned elastic holder. Therefore, the load applied to the portion where the aforementioned surface mount-type vibration motor is soldered to the aforementioned board can be further reduced. In other words, according to this invention, since the aforementioned elastic holder can reduce the load transmitted to the aforementioned motor support section of the aforementioned motor holder through the aforementioned motor holding section, the load applied to the portion where the aforementioned motor support section is soldered to the aforementioned board can be reduced. Therefore, the effect that the aforementioned surface mount-type vibration motor is prevented from separating from the aforementioned board is obtained.

According to the invention, since a pair of power supply terminals having the aforementioned bending sections are provided, the load applied to the portion where the aforementioned power supply terminals are soldered to the aforementioned board can be absorbed by the aforementioned bending sections. Therefore, the load applied to the portion where the aforementioned power supply terminals are soldered to the aforementioned board can be reduced to produce an effect of vibration absorption similar to the aforementioned motor holder. In other words, according to this invention, since a pair of power supply terminals having the aforementioned bending sections are provided, the load applied to the portion where the aforementioned power supply terminals are soldered to the aforementioned board can be absorbed by the aforementioned bending sections. Therefore, the load applied to the portion where the aforementioned power supply terminals are soldered to the aforementioned board can be reduced to produce an effect of vibration absorption similar to the aforementioned motor holder.

According to the invention, since the aforementioned elastic support body is provided, when the housing case is assembled, a load inclining the motor holding section in the plane direction of the board is supported and the load applied to the aforementioned motor holder is absorbed or received by the aforementioned elastic support body, and, in addition, vibration of the aforementioned vibration motor body can efficiently be transmitted to the housing case side during the motor operation. Further, generation of undesirable noise due to board vibration can be prevented. At the same time, according to this invention, since the aforementioned elastic support body can reduce the load transmitted to the aforementioned motor support sections of the aforementioned motor holder through the aforementioned motor holding section, the load applied to the portion where the aforementioned motor support section is soldered to the aforementioned board can be reduced. Therefore, the effect that the aforementioned surface mount-type vibration motor is prevented from separating from the aforementioned board is obtained.

According to the invention, since the aforementioned power supply terminal having the aforementioned bending section is provided, the load applied to the portions where the aforementioned power supply terminals are soldered to the aforementioned board can be absorbed by the aforementioned bending sections. Therefore, the load applied to the portions where the aforementioned power supply terminals are soldered to the aforementioned board can be reduced. Thus, the effect that the aforementioned power supply terminals of the aforementioned surface mount-type vibration motor is prevented from separating from the aforementioned board is obtained.

According to the invention, bonding strength between the aforementioned board and the aforementioned surface mount-type vibration motor can be maintained high, and by filling the clearance between the aforementioned case and the vibration motor with an elastic member of the elastic support body, loads applied to the aforementioned surface mount-type vibration motor almost in all directions can stably be borne by the aforementioned elastic support body and a possibility that the motor is separated from the board due to shock or vibration load can be lowered. This structure is also excellent in securely transmitting the vibration load from the motor to the housing case. At the same time, since it is possible to reduce the load applied to the portion where the aforementioned power supply terminal is soldered to the board, an effect that the aforementioned power supply terminal of the aforementioned surface mount-type vibration motor can be prevented from separating from the aforementioned board.

DESCRIPTION OF THE PREFERRED EMBODIMENTS

Now an embodiment relating to a surface mount-type vibration motor and an installation structure for a surface mount-type vibration motor according to this invention are described in detail referring to FIGS. 1 through 10.

Figure 1:
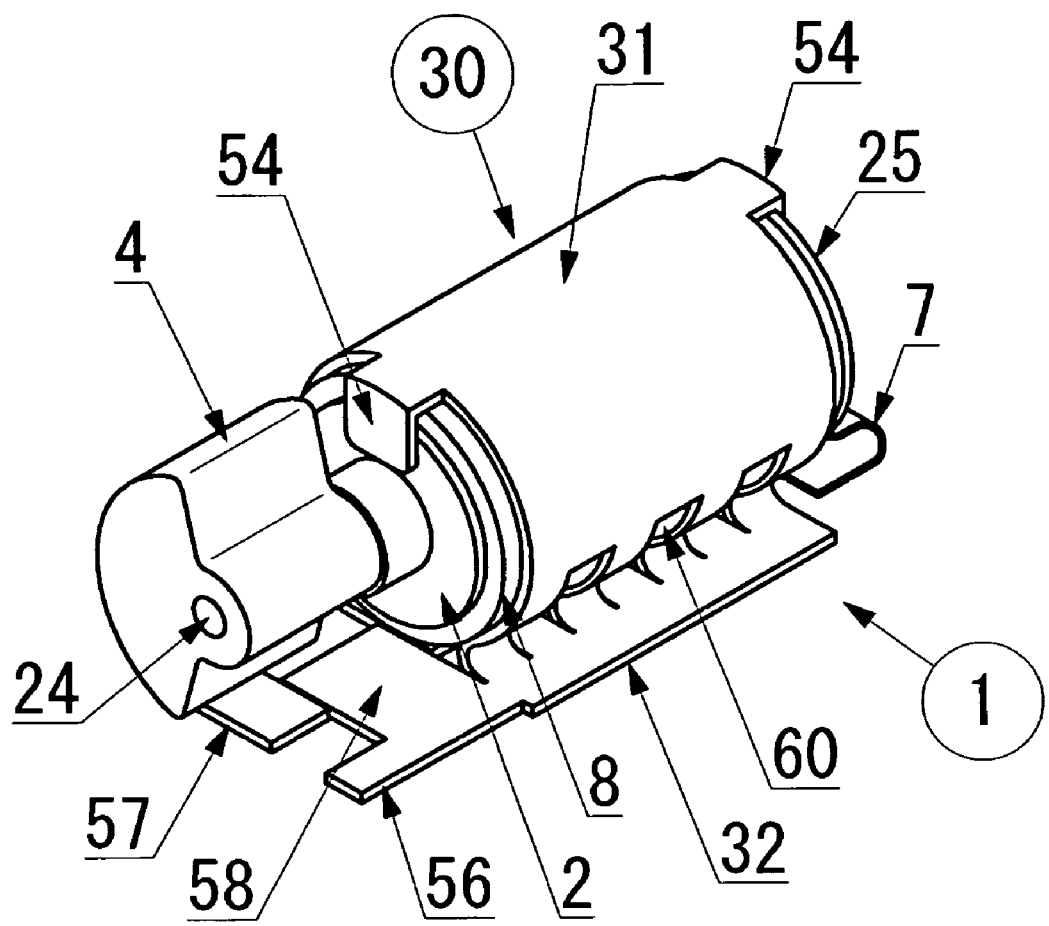
FIG. 1 is a perspective view showing an embodiment of a surface mount-type vibration motor relating to the invention.
Figure 2:
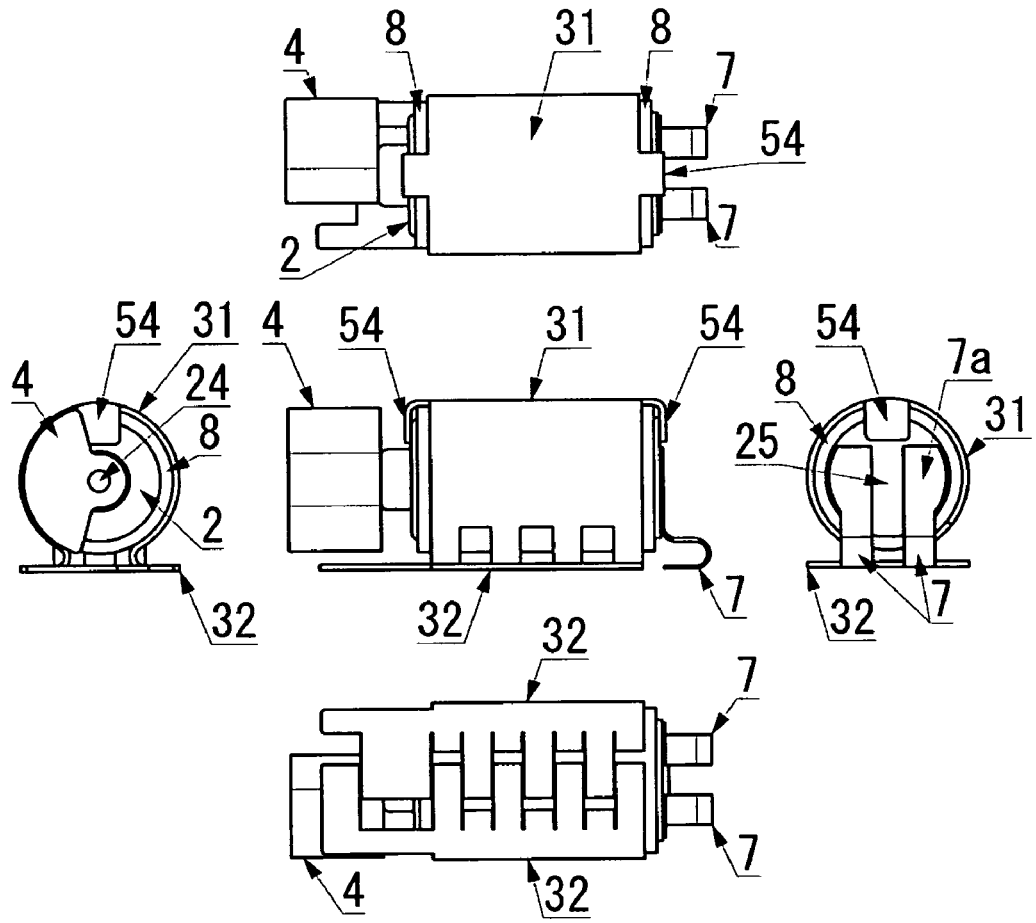
FIG. 2 is a five-face view showing the embodiment of the surface mount-type vibration motor relating to the invention.
Figure 3:
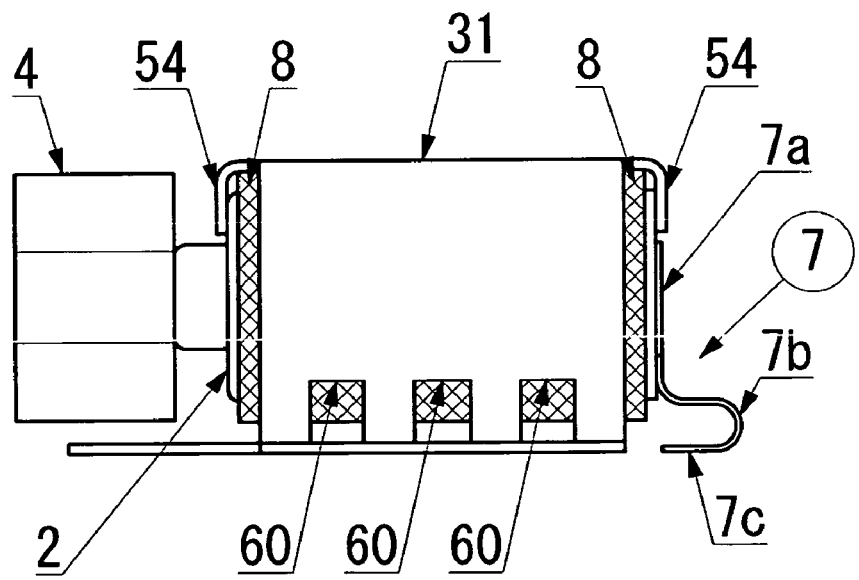
FIG. 3 is a side view showing the embodiment of the surface mount-type vibration motor relating to the invention.
Figure 4:
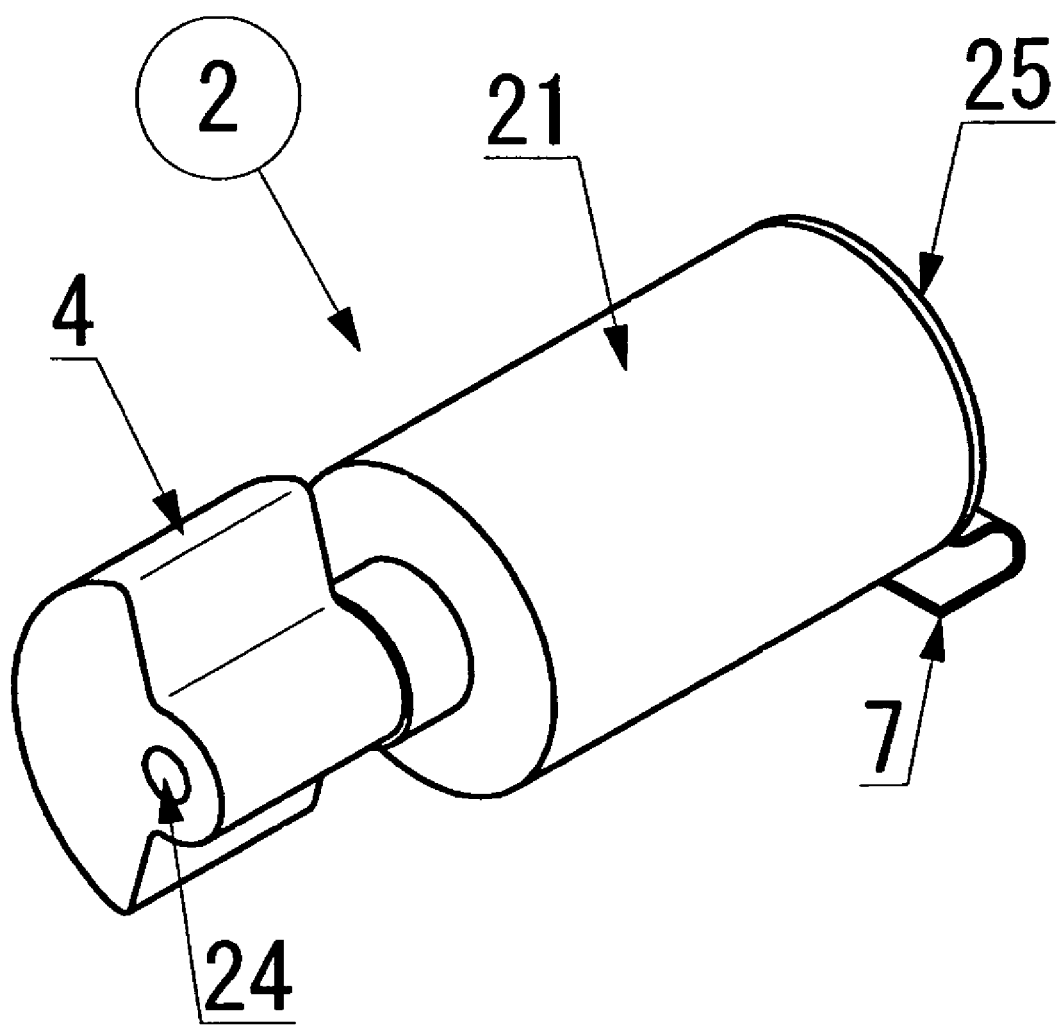
FIG. 4 is a perspective view showing a vibration motor body provided to the surface mount-type vibration motor relating to the invention.

FIGS. 1 through 3 show an example of a surface mount-type vibration motor relating to the embodiment. The surface mount-type vibration motor 1 is a surface mount component to be reflow-soldered to a solder bonding surface on a board on which cream solder is printed, or on a board of so-called circuit board 3 (see FIG. 9), and is an electronic component for a sound-less vibration alarm mainly provided to mobile devices. A vibration motor body 2 is provided inside the surface mount-type vibration motor 1 as shown in FIG. 4. This vibration motor body 2 is provided with an almost cylindrical motor housing 21 for containing a major portion of a rotation drive mechanism component.

A bearing section (not illustrated) is arranged inside the motor housing 21, and this bearing section rotatably supports an output shaft 24 of the rotating vibration motor body 2 with its distal end protruded from the motor housing 21.

Another end of the motor housing 21 is attached with a cap-like end bracket 25 covering the other end of the motor housing 21. This end bracket 25 is provided with a brush (not illustrated) attached inside the vibration motor 2 and terminal pieces to be electrically connected to the aforementioned brush.

The output shaft 24 of the vibration motor body 2 is attached with an eccentric weight 4 of which cross-section perpendicular to the output shaft 24 has a fan-like shape.

The aforementioned terminal pieces 7 are attached to the surface of the end bracket 25 of the vibration motor body 2 by fixing sections 7a extending toward the circuit board. The circuit board side ends of these fixing sections 7a are integrally provided with partially bending sections 7b having elasticity. Plane sections 7c of these bending sections 7b extending along the circuit board surface are to be soldered to a power supply land (not illustrated) provided to the circuit board side in a face-to-face condition. The power supply terminals 7 are composed of these fixing sections 7a, bending sections 7b and plane sections 7c.

Figure 6:
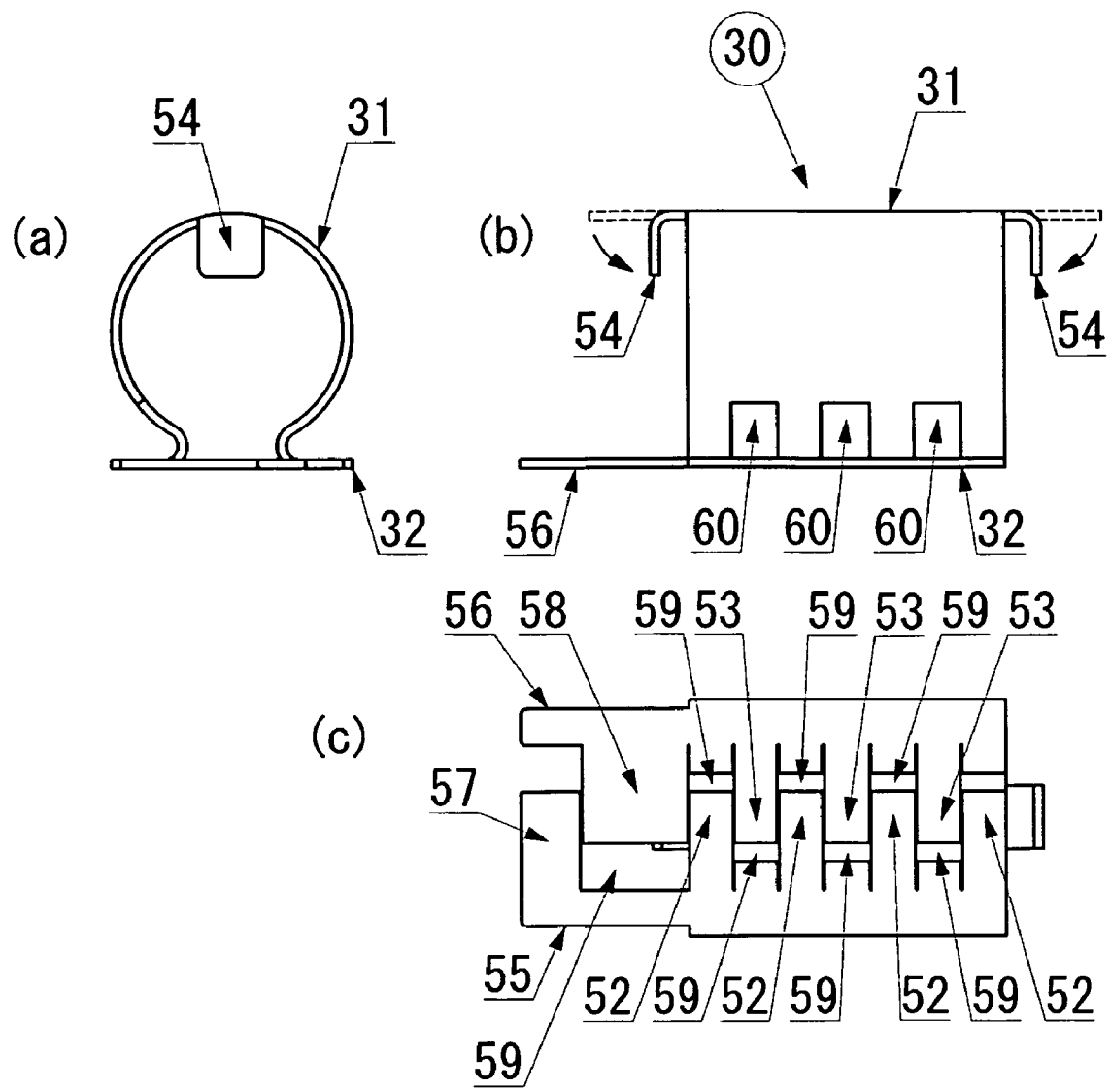
FIG. 6 includes a left side view (a), a front view (b) and a right side view (c) showing the motor holder to be provided to the surface mount-type vibration motor relating to the invention.
Figure 7:
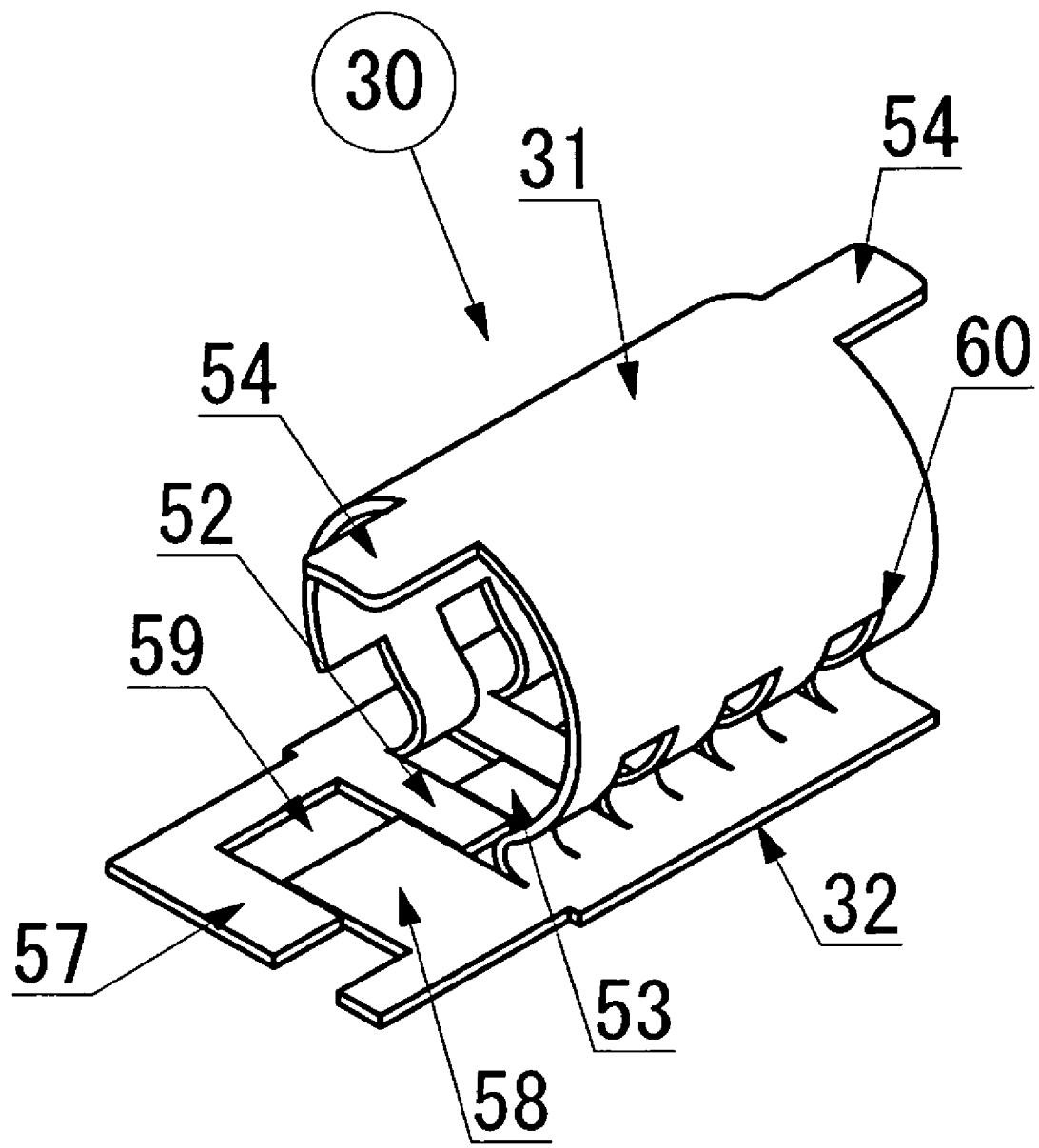
FIG. 7 is a perspective view showing an embodiment of the motor holder to be provided to the surface mount-type vibration motor relating to the invention.
Figure 8:
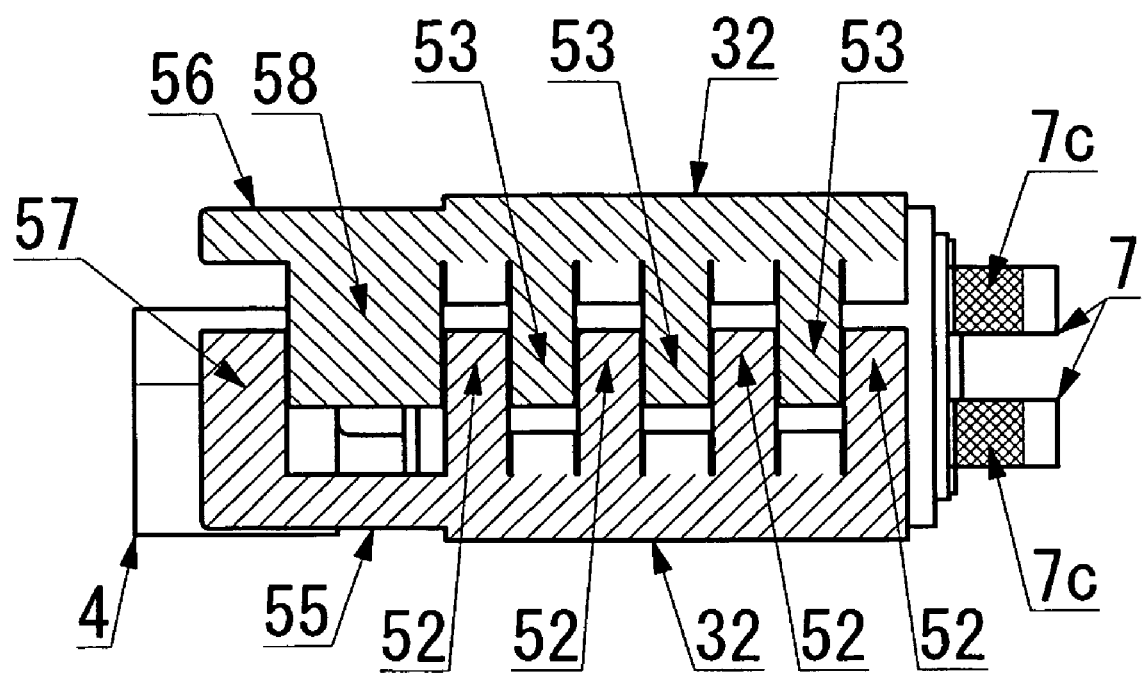
FIG. 8 is a schematic diagram viewed from a bottom showing a bonding face between the motor holder and a circuit board to be provided to the surface mount-type vibration motor relating to the invention.

A cylindrical periphery of the motor housing 21 of the vibration motor body 2 is attached with a cylindrical elastic holder 8 made from silicon rubber sheet etc. for covering the motor housing 21. The peripheral surface of this elastic holder 8 is attached with a motor holder 30 made from a metal sheet as shown in FIGS. 6 and 7. Although the elastic holder 8 made from silicon rubber is used in this embodiment, the elastic holder 8 can be made from any material having excellent thermal resistance such as fluororubber. In addition, any elastic material having a similar thermal resistant effect such as elastic resin coating for covering the periphery of the motor housing 21 can be used without limitation.

Figure 5:
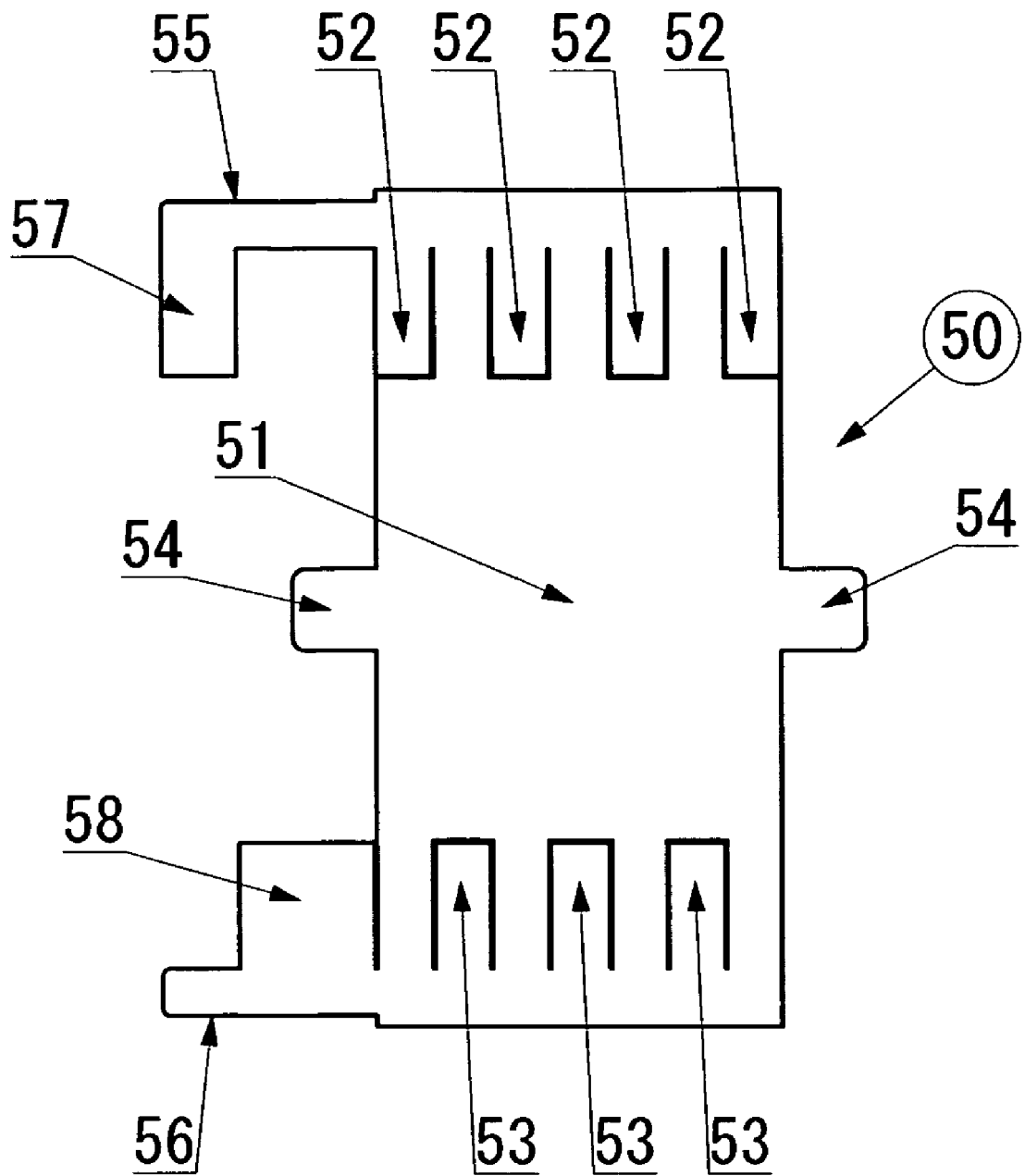
FIG. 5 is a development of a metal plate before being formed as a motor holder to be provided to the surface mount-type vibration motor relating to the invention.

FIG. 5 shows a metal sheet 50 that is a work piece to be formed by bending into the shape of the motor holder 30 shown in the aforementioned FIGS. 6 and 7. This metal sheet 50 is provided with a rectangular section 51 formed almost in a rectangle of which sides have a length almost equal to the axial length of the aforementioned motor housing.

One section close to one of the aforementioned sides of this rectangle 51 is provided with a plurality (four in this embodiment) of first contact sections 52 having slits perpendicular to the aforementioned side in a comb-like shape. One section close to another one of the aforementioned sides of this rectangle 51 is provided with a plurality (three in this embodiment) of second contact sections 53 having slits in the staggered positions against the first contact sections 52. When each of the first contact sections 52 and the second contact sections 53 are formed by bending so as to have a plane surface to be in contact with the circuit board, the distal ends of the second contact sections 53 are fitted in the spaces between the distal ends of the first contact sections 52 and the side walls (cross-sections) of the second contact sections 53 are almost in contact with the side walls of the first contact sections 52. Moreover, retaining pieces 54 are formed in each middle portion of the sides perpendicular the aforementioned sides of the rectangle 51 toward the outside of the rectangular section 51.

Corner sections of the side where one of the retaining pieces 54 of the rectangular section 51 is formed are provided with extended support sections 55 and 56 extending toward the outside of the rectangular section 51 in the same direction as the aforementioned retaining piece 54. The ends of these extended support sections 55 and 56 on the circuit board with the motor holder 30 installed to the vibration motor body 2 are located between the center of gravity G of the eccentric weight 4 and the distal end of the eccentric weight in the axial direction of the vibration motor.

A third contact section 57 in a rectangular shape having a specified length extending toward the inside of the rectangular section 51 in the direction perpendicular to the aforementioned sides is formed at the corner in the distal end of the extended supporting section 55. A fourth contact section 58 in a rectangular shape having a specified length extending toward the inside of the rectangular section 51 in the direction perpendicular to the aforementioned sides is formed at a partial section of the extended supporting section 56 opposing the extended supporting section 55. In addition, the internal side wall at the third contact section 57 of the rectangular section 51 is formed so as to be linearly arranged along the external side wall at the fourth contact section 58 of the rectangular section 51. The fourth contact section 58 in this embodiment has a length perpendicular to the aforementioned sides so that the side walls at the distal end of the fourth contact section 58 are in contact with the internal side walls of the extended supporting section 55 between the first contact section 52 and the third contact section 57 when the metal sheet 50 is formed to be in contact with the circuit board.

FIGS. 6 and 7 show the motor holder 30 obtained by forming the metal sheet 50 described in FIG. 5. A motor holding section 31 for holding the vibration motor body 2 attached with the aforementioned elastic holder 8 is formed by bending the aforementioned right and left retaining pieces 54 of the rectangular section 51 along the periphery of the cylindrical elastic holder 8.

The sections of the motor holder 30 to be arranged along the aforementioned circuit board surfaces consisting of the motor support sections 32, the extended support sections 55 and 56, the first contact sections 52, the second contact sections 53, the third contact section 57 and the fourth contact section 58 are formed by bending the sections close to the aforementioned sides of the rectangular section 51 in an arc shape having elasticity while providing with the aforementioned contact sections having distal ends in a rectangular wave form extending toward the inside of the vibration motor body 2.

The distal end sections of the first contact sections 52, the second contact sections 53, the third contact section 57 and the fourth contact section 58 of the motor holder 30 are engaged in a staggered condition. In this engagement, there arise clearances between the intermeshing sections of the contact sections. Solder receiving spaces 59 for receiving molten solder are formed at the distal end portions of the first contact sections 52, the second contact sections 53, the third contact section 57, and the fourth contact section 58 of the motor holder 30. In addition, openings 60 created by bending the first contact sections 52 and the second contact sections 53 are formed at the connection section between the motor holding section 31 and the motor support section 32 of the motor holder 30.

After inserting the vibration motor body 2 wound by the elastic holder 8 into the motor holding section 31 of the motor holder 30 described above, the retaining pieces 54 are bent toward the vibration motor body 2 as shown by solid and broken lines in FIG. 6(b). Thus, the vibration motor body 2 is positionally fixed in the axial direction of the output shaft of the motor holder 30. In each of the aforementioned views, for example, when the outer diameter of the eccentric weight 4 to be installed to the vibration motor body 2 is larger than the inner diameter of the motor holder 30, the eccentric weight 4 can be mounted to the output shaft 24 of the vibration motor body after installing the vibration motor body and motor holder.

The surface mount-type vibration motor 1 equipped with the vibration motor body 2, the power supply terminals 7, the elastic holder 8 and the motor holder 30 described above is placed on the specified location where cream solder for the circuit board is printed, and conveyed into a heating furnace with the circuit board. In this process, molten solder bonds the hatched surfaces of the surface mount-type vibration motor 1 shown in FIG. 8 consisting of the motor support sections 32, the extended support sections 55 and 56, the first contact sections 52, the second contact sections 53, the third contact section 57 and the fourth contact section 58 with the surface of the circuit board and the cross-hatched surfaces consisting of the plane sections 7c of the power supply terminals 7 with the power supply of the circuit board.

In the surface mount-type vibration motor 1 of which reflow solder processing is finished in the heating furnace, molten solder not only spreads over the aforementioned hatched contact surfaces but also spreads around the periphery of the motor support section 32 and the side sections of the plate material, including the aforementioned solder receiving spaces 59, to form a mound-like solidified solder. The clearances generated by combining the aforementioned first contact sections 52, the second contact sections 53, the third contact section 57, and the fourth contact section 58 is also filled with molten solder to form a mound-like solidified solder. Therefore, a bonding area is substantially enlarged and higher bonding strength is obtained.

Now a specific installation structure for the surface mount-type vibration motor 1 that is used for installing the surface mount-type vibration motor 1 to a mobile device is described. Generally, a mobile device is provided with a pair of housing cases (A and B) that form a frame body by fitting them with each other. The case A and the circuit board 3 on which the surface mount-type vibration motor 1 is soldered are fixed at the position where the case B faces the bottom of the circuit board 3 as shown in FIG. 9.

Figure 9:
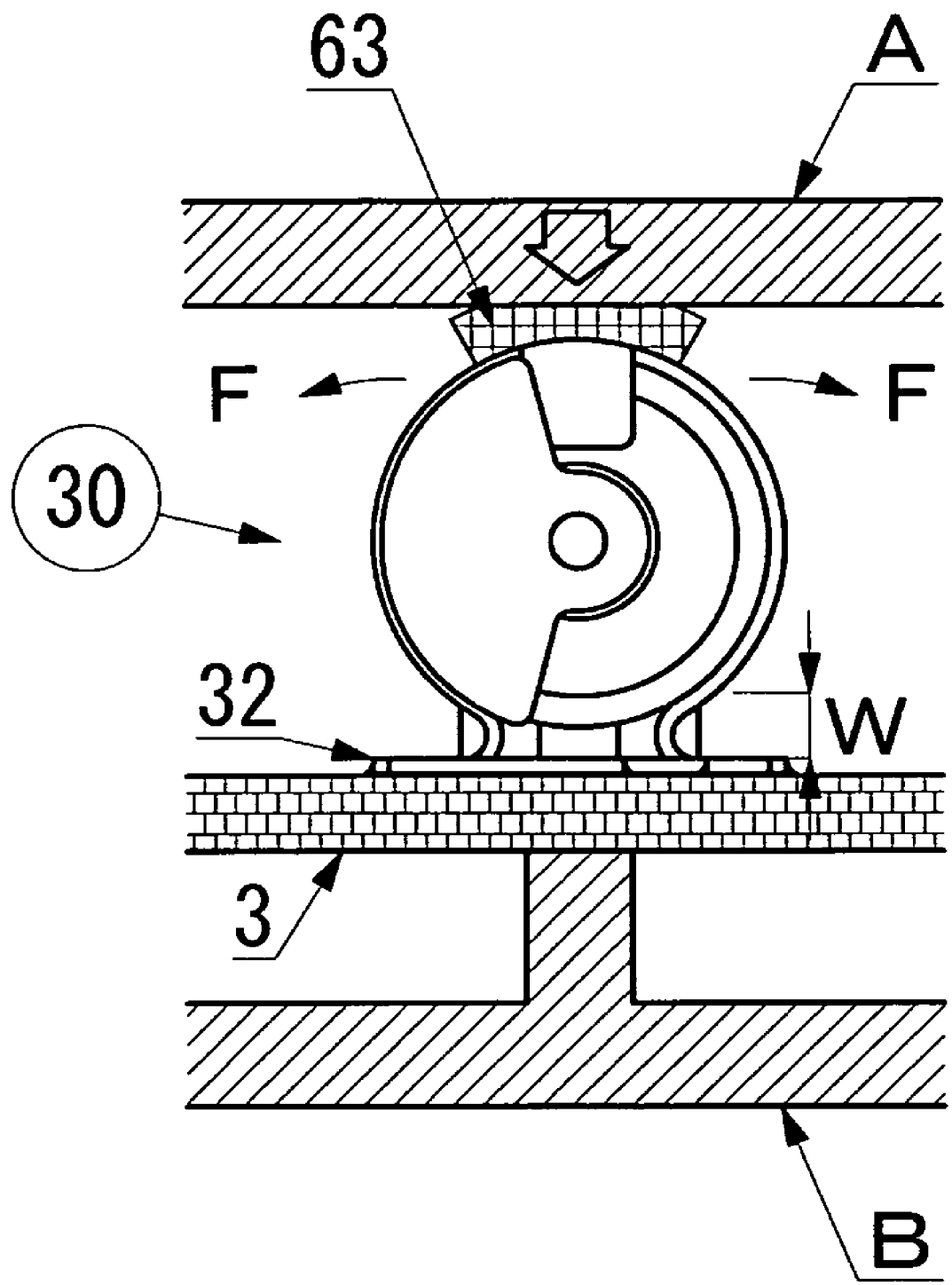
FIG. 9 is a schematic diagram showing an installation structure for the surface mount-type vibration motor and the circuit board relating to the invention.
Figure 10:
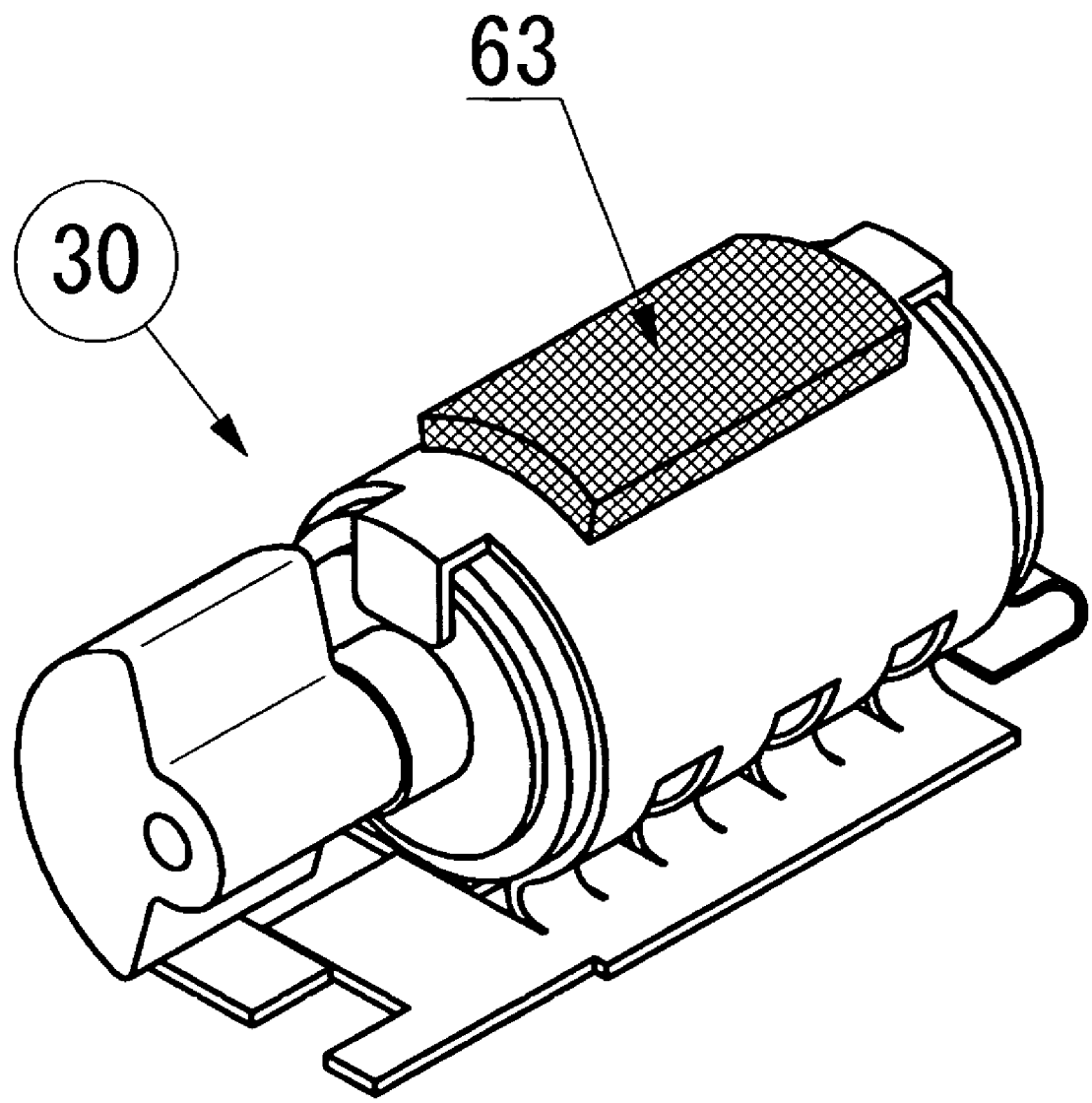
FIG. 10 is a perspective view showing an embodiment of the surface mount-type vibration motor attached with an elastic support body.

As shown in FIG. 9, a sheet-like elastic support body 63 is installed between the surface mount-type vibration motor 1 and the case A. When the aforementioned pair of cases are fitted with each other and bonded, the surface mount-type vibration motor 1 is pressed onto the circuit board 3 by the case A through the elastic support body 63 and also pressed by the case B through the circuit board 3. The aforementioned elastic support body 63 can be installed to either one of the top of the surface mount-type vibration motor 1 or the internal surface of the case A to produce a good effect only if the elastic support body 63 is present between the surface mount-type vibration motor 1 and the case A.

First, the surface mount-type vibration motor 1 according to this embodiment is electrified from the power supply land (not illustrated) provided to the circuit board 3 through the power supply terminals 7 to drive a rotor inside the motor housing to rotate the eccentric weight 4 installed to the output shaft end. Rotation of the eccentric weight 4 generates vibration that is added to the entire housing of the surface mount-type vibration motor 1, and the vibration is also transmitted to the entire mobile device playing a role of the housing case through the circuit board 3 on which the surface mount-type vibration motor 1 is installed.

Since the surface mount-type vibration motor 1 according to this embodiment is provided with the power supply terminals 7 having the bending sections 7b as shown in the aforementioned FIG. 3, a load applied to the portion where the power supply terminals 7 of the surface mount-type vibration motor 1 are soldered to the circuit board 3 can elastically be absorbed by the bending sections 7b. Therefore, the load applied to the portion where the power supply terminals 7 of the surface mount-type vibration motor 1 are soldered to the circuit board 3 can be reduced, leading to stabilization of the bonding condition of the soldered portion and improvement in reliability.

Since the surface mount-type vibration motor 1 relating to this embodiment is provided with the motor holder 30 of which a connection section (W shown in FIG. 9) between the motor holding section 31 and the motor support sections 32 is formed in an arc shape having elasticity, the load applied to the portion where the surface mount-type vibration motor 1 is soldered to the circuit board 3 can elastically be absorbed by the aforementioned connection section. Therefore, the load applied to the portion where the surface mount-type vibration motor 1 is soldered to the circuit board 3 can be reduced.

The above-mentioned effect also has a function for alleviating a shock load acting on the vibration motor body when the housing case is dropped or impacted. In other words, the vibration motor body 2 can be protected from an external shock load.

Since the surface mount-type vibration motor 1 relating to this embodiment is equipped with the motor holder 30, wherein the motor support sections 32 are provided to the right and left end sections of the motor holding section 31 that extends from the aforementioned retaining pieces 54 in the right and left direction, the load applied to the portion where the surface mount-type vibration motor 1 is soldered to the circuit board 3 can effectively and elastically absorbed by the connection section (W shown in FIG. 9) between the motor holding section 31 and the motor support sections 32 provided in the sections close to the aforementioned right and left ends. Therefore, the load transmitted to the portion where the surface mount-type vibration motor 1 is soldered to the circuit board 3 can effectively be reduced. In addition, the surface mount-type vibration motor 1 relating to this embodiment is provided with the opening sections 60 of which the shape is determined by the shapes of the first contact sections 52 and the second contact sections 53. A modulus of section of the aforementioned connection section can be adjusted by changing the ratio of the opening sections 60 to the band width of the motor holder 30.

Since the surface mount-type vibration motor 1 relating to this embodiment is provided with the first contact sections 52, the second contact sections 53, the third contact section 57 and the fourth contact section 58, a soldering area of the interface between the circuit board 3 and the surface mount-type vibration motor 1 can be enlarged. Therefore solder bonding strength at the interface between the circuit board 3 and the surface mount-type vibration motor 1 can be increased and, at the same time, the stress applied to the portion where the surface mount-type vibration motor 1 is soldered to the circuit board 3 can be reduced.

Since the surface mount-type vibration motor 1 relating to this embodiment is provided with the solder receiving sections 59, the first contact sections 52, the second contact sections 53, the third contact section 57, and the fourth contact section 58 can integrally be bonded with solder received by the solder receiving sections 59. Therefore, even when a load along the circuit board 3 is applied to the surface mount-type vibration motor 1, the surface mount-type vibration motor 1 can be bonded by the aforementioned mound-like solidified solder.

Since the surface mount-type vibration motor 1 relating to this embodiment is provided with the expanded supporting sections 55 and 56, a load applied to the portion where the surface mount-type vibration motor 1 is soldered to the circuit board 3 can be reduced by allowing the expanded supporting sections 55 and 56 soldered to the circuit board 3 to partially bear the load even when the load that makes the eccentric weight 4 approach to the circuit board 3 is applied to the portion where the surface mount-type vibration motor 1 is soldered to the circuit board 3.

Since the surface mount-type vibration motor 1 relating to this embodiment is pressed onto the circuit board 3 through the elastic support body 63 when installed to the aforementioned mobile device, the bonding strength at the interface between the aforementioned surface mount-type vibration motor 1 and the aforementioned circuit board 3 can be increased and, in addition, the load (F shown in FIG. 9) applied to the surface mount-type vibration motor 1 from the case 62 due to dropping the aforementioned mobile device can be held by the elastic support body to reduce the shock load.

Since the surface mount-type vibration motor 1 relating to this embodiment is provided with the elastic holder 8, the load directly applied to the vibration motor body 2 from the motor holder 30 due to external shock caused by dropping etc. can be absorbed. Therefore, the load applied to the portion where the surface mount-type vibration motor 1 is soldered to the circuit board 3 can be reduced to maintain the vibration motor body 2 stably.

In the surface mount-type vibration motor 1 relating to this embodiment, since the load applied to the portion where the surface mount-type vibration motor 1 is soldered to the circuit board 3 can be reduced by the elastic holder 8 as described above, an effect of preventing the aforementioned surface mount-type vibration motor 1 from separating from the aforementioned circuit board 3 can be obtained.

In the surface mount-type vibration motor 1 relating to this embodiment, since the load transmitted to the portion where the power supply terminals 7 of the surface mount-type vibration motor 1 is soldered to the circuit board 3 can be reduced, an effect of preventing the power supply terminals 7 of the surface mount-type vibration motor 1 from separating from the circuit board 3 can be obtained.

In the surface mount-type vibration motor 1 relating to this embodiment, since the load applied to the portion where the surface mount-type vibration motor 1 is soldered to the circuit board 3 can be reduced by the connection section between the motor holding section 31 and the motor support sections 32, an effect of preventing the surface mount-type vibration motor 1 from separating from the circuit board 3 can be obtained.

In the surface mount-type vibration motor 1 relating to this embodiment, since the load applied to the portion where the surface mount-type vibration motor 1 is soldered to the circuit board 3 can effectively be reduced by the connection section between the motor holding section 31 and the motor support sections 32 provided to the sections close to the aforementioned right and left ends, an effect of effectively preventing the surface mount-type vibration motor 1 from separating from the circuit board 3 can be obtained.

In the surface mount-type vibration motor 1 relating to this embodiment, bonding strength can be increased by the first contact sections 52, the second contact sections 53, the third contact section 57 and the fourth contact section 58, and, at the same time, the stress applied to the portion where the surface mount-type vibration motor 1 is soldered to the circuit board 3 can be reduced, an effect of preventing the surface mount-type vibration motor 1 from separating from the circuit board 3 can be obtained.

In the surface mount-type vibration motor 1 relating to this embodiment, since the surface mount-type vibration motor 1 can be bonded by the aforementioned mound-like solidified solder when a load along the circuit board 3 is applied to the surface mount-type vibration motor 1, an effect of preventing the surface mount-type vibration motor 1 from separating from the circuit board 3 can be obtained even when the load along the circuit board 3 is applied to the surface mount-type vibration motor 1.

In the surface mount-type vibration motor 1 relating to this embodiment, since the load applied to the portion where the surface mount-type vibration motor 1 is soldered to the circuit board 3 can be reduced by allowing the distal end sections of the extended support sections to receive the load applied to the portion where the surface mount-type vibration motor 1 is soldered to the circuit board 3 when a load that makes the eccentric weight 4 approach to the circuit board 3 is applied to the portion where the surface mount-type vibration motor 1 is soldered to the circuit board 3, an effect of preventing the surface mount-type vibration motor 1 from separating from the circuit board 3 can be obtained even when the aforementioned load is applied.

Since the surface mount-type vibration motor 1 relating to this embodiment is provided with the extended support sections 55 and 56, an effect of preventing the surface mount-type vibration motor from tilting against the circuit board 3 is obtained in the stage that the surface mount-type vibration motor 1 is placed on the circuit board 3 even when the load that makes the eccentric weight 4 approach to the circuit board 3 is applied to the surface mount-type vibration motor 1.

In the surface mount-type vibration motor 1 relating to this embodiment, since a modulus of section of the aforementioned connection section can be adjusted by changing the ratio of the opening sections 60 to the band width of the motor holder 30, the modulus of section of the aforementioned connection section can be changed to a suitable value regardless of a material of the metal sheet 50.

Since the surface mount-type vibration motor 1 relating to this embodiment is pressed onto the circuit board 3 through the elastic support body 63 when installed to the aforementioned mobile device, an effect of preventing the surface mount-type vibration motor 1 from separating from the circuit board 3 can be obtained. In addition, in the surface mount-type vibration motor 1 relating to this embodiment, since vibration is transmitted not only to the circuit board 3 but also to the case A through an elastic member when the surface mount-type vibration motor 1 is installed to the aforementioned mobile device, an effect capable of efficiently transmitting vibration of the entire vibration motor to the mobile device can be obtained.

The invention claimed is:

1. A surface mount-type vibration motor comprising a vibration motor body of which an output shaft end is attached with an eccentric weight and a motor holder that is installed to said vibration motor body to place said vibration motor body on a board, a part of said motor holder is bonded on said board using reflow solder, wherein said motor holder is formed by a metal sheet, has a motor holding section for covering a periphery of said vibration motor body to hold said vibration motor body and has motor support sections that extend in an axial direction of said output shaft over said board and are in contact with said board, and a connection section extending from said motor holding section to said motor support section that is bent in an arc shape having elasticity and is provided with openings.

2. A surface mount-type vibration motor according to claim 1, wherein end sections of said motor support sections of said motor holder are provided with extended support sections that extend in an axial direction of said output shaft over said board and are in contact with said board, and distal ends of said extended support sections of said motor holder is positioned between the gravity center of said eccentric weight and the distal end of said eccentric weight in the axial direction of the said output shaft.

3. A surface mount-type vibration motor according to claim 2, wherein said motor holding section of said motor holder is extended along the periphery of said vibration motor body in a cylindrical shape when installed to said vibration motor body, said motor support sections of said motor holder are provided with uniform plane sections extending in an axial direction of said motor holding section of said motor holder from periphery of said vibration motor body toward an outside.

4. A surface mount-type vibration motor according to claim 1, wherein said motor holding section of said motor holder is extended along the periphery of said vibration motor body in a cylindrical shape when installed to said vibration motor body, said motor support sections of said motor holder are provided with uniform plane sections extending in an axial direction of said motor holding section of said motor holder from periphery of said vibration motor body toward an outside.

5. A surface mount-type vibration motor according to claim 1, wherein one end of said motor support section of said motor holder is provided with a first contact section that is in contact with said board and extends toward an inside of said vibration motor body soldered to said board, and another end of said motor support section of said motor holder is provided with a second contact section that is in contact with said board and extends toward said inside of said vibration motor body soldered to said board.

6. A surface mount-type vibration motor according to claim 5, wherein said first contact section and said second contact section are combined alternately on said board and are arranged to provide said combined portion with an opening.

7. A surface mount-type vibration motor according to claim 1, wherein an elastic holder for covering said vibration motor body is provided between said vibration motor body and said motor holding section.

8. A surface mount-type vibration motor according to claim 1, wherein said vibration motor body comprises a power supply terminal to be soldered to a power supply land provided to said board, and a part of said power supply terminal is provided with an elastic bending section.

9. A surface mount-type vibration motor comprising a vibration motor body of which an output shaft end is attached with an eccentric weight and a motor holder to be installed to said vibration motor body to place said vibration motor body on a board, and a part of said motor holder is bonded on said board using reflow solder, wherein said motor holder is provided with a motor holding section for covering a periphery of said vibration motor body to hold said vibration motor body and motor support sections that extend in an axial direction of said output shaft over said board and are in contact with said board and an uppermost portion of said motor holder for holding said vibration motor body at the position opposite to said motor holder is provided with an elastic support body; wherein said vibration motor body comprises a power supply terminal to be soldered to a power supply land provided to said board and said power supply terminal comprises an elastic bending section.

10. An installation structure for a surface mount-type vibration motor, wherein the surface mount-type vibration motor, comprising a vibration motor body of which an output shaft end is attached with an eccentric weight and a motor holder that has a motor holding section for covering a periphery of said vibration motor body to hold said vibration motor body, a motor support sections that extend in an axial direction of said output shaft over said board and are contact with said board, a connection section of said motor holder between said motor holding section and said motor support sections is formed by a metal sheet in an arc shape, said surface mount-type vibration motor is bonded to said board that is fixed between one of a pair of housing cases forming a frame body by fitting to each other and assembling them and an internal board using reflow solder, an elastic support body is arranged between said case of said pair and said surface mount-type vibration motor, and said surface mount-type vibration motor is held between an internal board and a housing case through said elastic support body by assembling said pair of housing cases.

* * * * *